(12) United States Patent
Lipson

(10) Patent No.: US 10,027,091 B2
(45) Date of Patent: Jul. 17, 2018

(54) MONOLITHIC TWO-DIMENSIONAL VCSEL ARRAY

(71) Applicant: GM GLOBAL TECHNOLOGY OPERATIONS LLC, Detroit, MI (US)

(72) Inventor: Ariel Lipson, Tel Aviv (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/623,982

(22) Filed: Jun. 15, 2017

(65) Prior Publication Data

US 2017/0365984 A1    Dec. 21, 2017

Related U.S. Application Data

(60) Provisional application No. 62/350,369, filed on Jun. 15, 2016.

(51) Int. Cl.
  *H01S 5/026*  (2006.01)
  *H01S 5/42*   (2006.01)
  *H01S 5/042*  (2006.01)
  *H01S 5/022*  (2006.01)

(52) U.S. Cl.
  CPC .......... *H01S 5/423* (2013.01); *H01S 5/02272* (2013.01); *H01S 5/0425* (2013.01)

(58) Field of Classification Search
  CPC ..... H01S 5/02272; H01S 5/34333; H01S 5/00
  USPC ..................................... 372/50.124; 356/610
  See application file for complete search history.

(56) References Cited

U.S. PATENT DOCUMENTS

| 2008/0205462 A1* | 8/2008 | Uchida | H01S 5/423 372/34 |
| 2009/0010297 A1* | 1/2009 | Uchida | H01S 5/18344 372/50.124 |
| 2010/0124246 A1* | 5/2010 | Lutgen | H01L 33/0095 372/50.1 |

* cited by examiner

*Primary Examiner* — Tuan Nguyen
(74) *Attorney, Agent, or Firm* — Cantor Colburn LLP

(57) ABSTRACT

A two-dimensional VCSEL array may include a VCSEL array including a VCSELs arranged in a two dimensional matrix forming a monolithic structure, a light-emitting surface, and a rear surface, first metal contacts provided on the light-emitting surface; and second metal contacts provided on the rear surface. The VCSELs may be arranged in first lines in a first direction and second lines in a second direction non-parallel to the first direction. Each of the first metal contacts may be electrically connected to each VCSEL of a corresponding first line. Each of the plurality of second metal contacts may be electrically connected to each VCSEL of a corresponding second line. The first metal contacts and second metal contacts may be arranged such that each combination of a first metal contact and a second metal contact is electrically connected to one VSCEL.

19 Claims, 12 Drawing Sheets

MONOLITHIC TWO-DIMENSIONAL VCSEL ARRAY

CROSS REFERENCE TO RELATED APPLICATIONS

Priority under 35 U.S.C. § 119(e) is claimed from U.S. Provisional Application 62/350,369, filed on Jun. 15, 2016, the disclosure of which is incorporated by reference.

FIELD OF THE INVENTION

The subject invention relates to vertical-cavity surface-emitting lasers (VCSELs).

BACKGROUND

Lasers may be used in LIDAR (Light Detection and Ranging) systems to acquire three-dimensional information of an environment.

For example, a laser can be aimed and the time between activating the laser and receiving a reflection of the laser can be used to determine a distance to the object. If the laser or an array of lasers is aimed in a variety of directions, the resulting information can be reconstructed to generate three-dimensional information of an environment.

Rotating lasers require significant mechanical structure, increasing the complexity, size, and cost of the LIDAR device. Thus, solid state LIDAR systems have been developed in which a two dimensional array of VCSELS is used, with each individual VCSEL being aimed at a separate region of the three-dimensional environment. The solid state LIDAR systems are more robust, smaller in size, and less expensive than a rotating laser LIDAR system.

FIG. 1 shows an example of a VCSEL chip 10 that may include several individual VCSELs 12. FIG. 2 shows how VCSEL chips 10 may be conventionally arranged to achieve a two-dimensional VCSEL array. For example, rows of VCSELs can be formed by arranging VCSEL chips 10 end to end. A common cathode trace 22 may be provided for each row of VCSEL chips, connecting to an electrode on the rear side of each VCSEL in the row. Additionally, wirings 24 may be used to connect VCSELs in a columnar direction, with anode traces 20 being connected to each column of VCSELs.

However, in the structure of FIG. 2, the wirings 24 add complexity to the manufacturing process, thereby increasing cost. Also, using wirings 24 to connect one-dimensional arrays of VCSELs results in inefficient use of space and waste of VCSEL area.

Accordingly, it is desirable to provide a monolithic two-dimensional VCSEL array for use in a solid state LIDAR system in order to reduce manufacturing costs and make more efficient use of VCSEL space.

SUMMARY OF THE INVENTION

In one exemplary embodiment of the invention, a two-dimensional VCSEL array may include a VCSEL array including a plurality of VCSELs arranged in a two dimensional matrix, the plurality of VCSELs forming a monolithic structure, a light-emitting surface; and a rear surface opposite to the light emitting surface, wherein the plurality of VCSELs may be arranged in a plurality of first lines of VCSELs in a first direction and a plurality of second lines of VCSELs in a second direction, the first direction being non-parallel to the second direction; a plurality of first metal contacts provided on the light-emitting surface; and a plurality of second metal contacts provided on the rear surface. Each of the plurality of first metal contacts may be electrically connected to each VCSEL of a corresponding first line of the plurality of first lines of VCSELs. Each of the plurality of second metal contacts may be electrically connected to each VCSEL of a corresponding second line of the plurality of second lines of VCSELs. The plurality of first metal contacts and the plurality of second metal contacts may be arranged such that each combination of a first metal contact and a second metal contact is electrically connected to one VSCEL of the plurality of VCSELs.

In another exemplary embodiment of the invention, a method of manufacturing a two-dimensional VCSEL array may include providing a VCSEL array including a plurality of VCSELs arranged in a two dimensional matrix, the plurality of VCSELs forming a monolithic VCSEL structure having a light-emitting surface and a rear surface opposite to the light-emitting surface, a front metal layer provided on the light-emitting surface; and a rear metal layer provided on the rear surface, wherein the plurality of VCSELs may be arranged in a plurality of first lines of VCSELs in a first direction and a plurality of second lines of VCSELs in a second direction, the first direction being non-parallel to the second direction; patterning the front metal layer into a plurality of first metal contacts, each of the plurality of first metal contacts being electrically connected to each VCSEL of a corresponding first line of the plurality of first lines of VCSELs; forming, through the rear metal layer and into the monolithic VCSEL structure, a plurality of trenches to a predetermined depth so as to separate the other of the front metal layer and the rear metal layer into a plurality of second metal contacts, each of the plurality of second metal contacts being electrically connected to each VCSEL of a corresponding second line of the plurality of second lines of VCSELs. The plurality of first metal contacts and the plurality of second metal contacts may be arranged such that each combination of a first metal contact and a second metal contact is electrically connected to one VSCEL of the plurality of VCSELs.

In yet another exemplary embodiment of the invention, a method of manufacturing a two-dimensional VCSEL array may include providing a VCSEL array including a plurality of VCSELs arranged in a two dimensional matrix, the plurality of VCSELs forming a monolithic VCSEL structure having a light-emitting surface and a rear surface opposite to the light-emitting surface, and a front metal layer provided on the light-emitting surface, wherein the plurality of VCSELs are arranged in a plurality of first lines of VCSELs in a first direction and a plurality of second lines of VCSELs in a second direction, the first direction being non-parallel to the second direction; patterning the front metal layer into a plurality of first metal contacts, each of the plurality of first metal contacts being electrically connected to each VCSEL of a corresponding first line of the plurality of first lines of VCSELs; forming a plurality of a plurality of second metal contacts on the rear surface, each of the plurality of second metal contacts being electrically connected to each VCSEL of a corresponding second line of the plurality of second lines of VCSELs. The plurality of first metal contacts and the plurality of second metal contacts may be arranged such that each combination of a first metal contact and a second metal contact is electrically connected to one VSCEL of the plurality of VCSELs.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
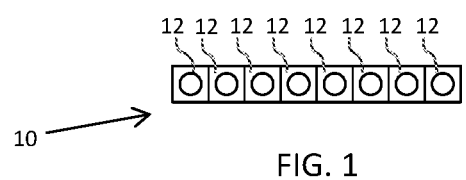
FIG. 1 is a diagram of a one-dimensional VCSEL chip.
Figure 2:
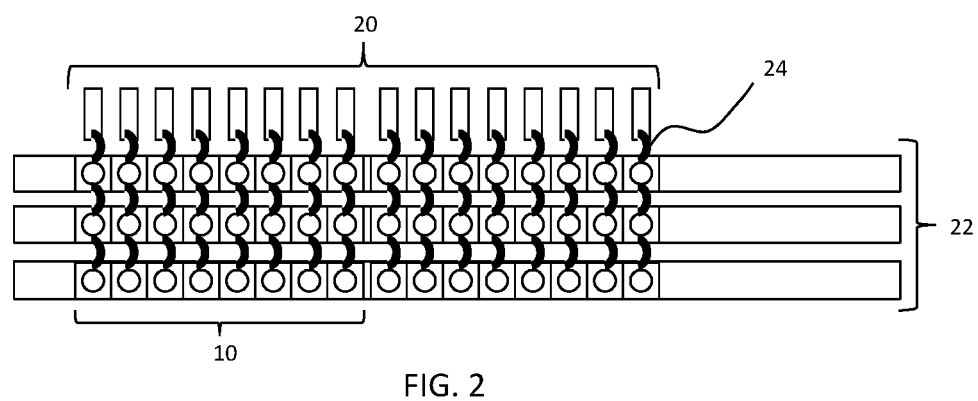
FIG. 2 is a diagram of a two-dimensional array of VCSELs made from one-dimensional VCSEL chips.

The following description is merely exemplary in nature and is not intended to limit the present disclosure, its application or uses. It should be understood that throughout the drawings, corresponding reference numerals indicate like or corresponding parts and features. Additionally, axis lines, where shown, are merely provided for the ease of understanding the corresponding view, and are not meant to imply that any particular orientation is required. Additionally, the use of the words "front" and "rear" in the following description are for convenience only, and do not imply any specific configuration or orientation of the structure.

In accordance with an exemplary embodiment of the invention, FIGS. 3-6 illustrate an example of a monolithic two-dimensional VCSEL array 100. The monolithic two-dimensional VCSEL array 100 may include a monolithic structure 102 that includes a two-dimensional matrix of VCSELs 112. Monolithic structure 102 may be a VCSEL wafer formed by a photolithographic process, for example.

Figure 3:
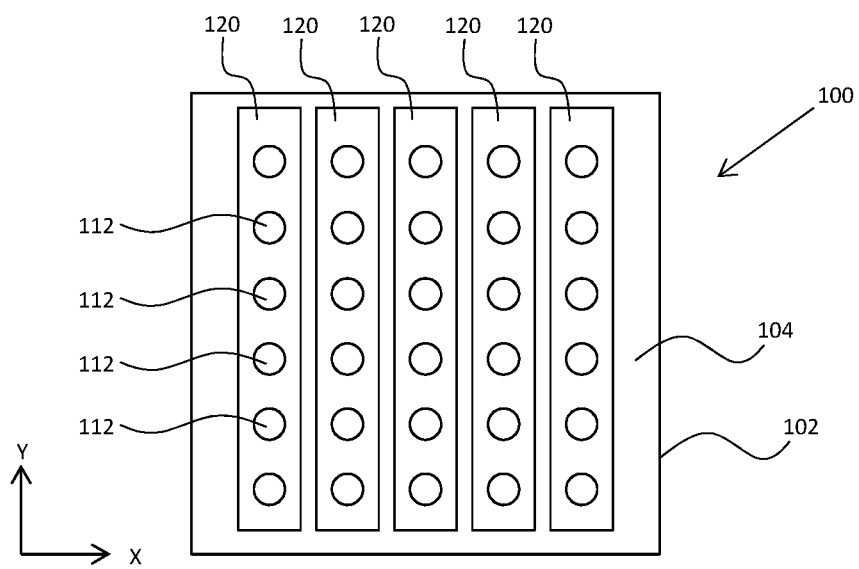
FIG. 3 is a front view of a monolithic two-dimensional VCSEL array according to an embodiment.

FIG. 3 shows a front view of monolithic two-dimensional VCSEL array 100. The plurality of VCSELs 112 may be arranged into a plurality of columns and rows. In other words, the columns of VCSELs 112 correspond to a plurality of first lines of VCSELs in a first direction (the y-direction in the case of FIG. 3), and the rows correspond to a plurality of second lines of VCSELs in a second direction (the x-direction in the case of FIG. 3). The first and the second direction are perpendicular to each other, but the structure is not limited to this embodiment. For example, it will be understood that the first direction may be at an acute or obtuse angle relative to the second direction (see FIG. 13, described herein). FIG. 3 also shows that the first lines (i.e., columns) may be mutually parallel and that the second lines (i.e., rows) may be mutually parallel.

A plurality of first metal contacts 120 may be formed on a front surface 104 of monolithic structure 102. First metal contacts 120 are electrically connected to each VCSEL 112 of a corresponding first line of the plurality of first lines of VCSELs. In other words, the VCSELs 112 electrically connected by a particular first metal contact 120 correspond to a first line of VCSELs. In one embodiment, first metal contacts 120 are formed of gold, but it will be understood that other metals suitable for use as an electrode may also be used.

Additionally, FIG. 3 shows a 5×6 array of VCSELs 112. However, it will be understood that the invention is not limited to this embodiment. The 5×6 array is shown merely as a matter of convenience, and it will be understood that any size two-dimensional array of VCSELs may be used.

Figure 4:
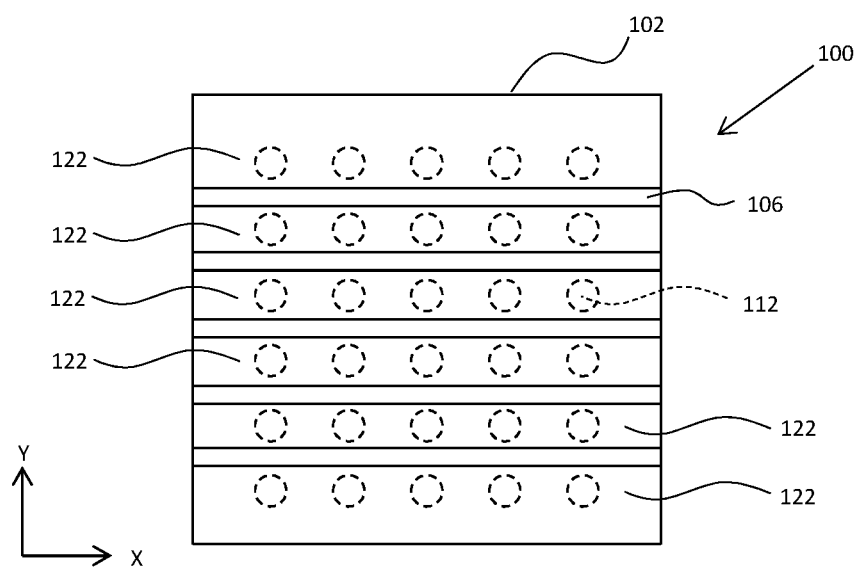
FIG. 4 is a rear view of a monolithic two-dimensional VCSEL array according to an embodiment.

FIG. 4 shows a rear view of monolithic two-dimensional VCSEL array 100. The dashed lines show the corresponding positions of individual VCSELs 112. Second metal contacts 122 are formed on a rear surface 106 of the monolithic structure 102. Second metal contacts 122 are electrically connected to each VCSEL 112 of a corresponding second line (i.e., row) of the plurality of second lines of VCSELs. In other words, VCSELs 112 electrically connected by a particular second metal contact 122 correspond to a second line of VCSELs. In one embodiment, second metal contacts 122 are formed of gold, but it will be understood that other metals suitable for use as an electrode may also be used.

Figure 5:
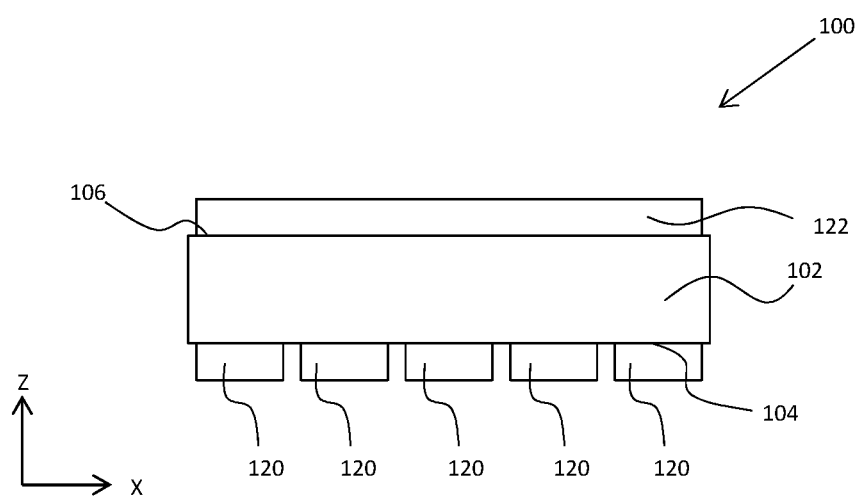
FIG. 5 is a side view of a monolithic two-dimensional VCSEL array according to an embodiment.

FIG. 5 shows a side view of monolithic two-dimensional VCSEL array 100, looking along a y-direction. It will be understood that the thickness of first metal contacts 120, monolithic structure 102, and second metal contacts 122 are not meant to be limiting and may have been altered for illustrative purposes.

Figure 6:
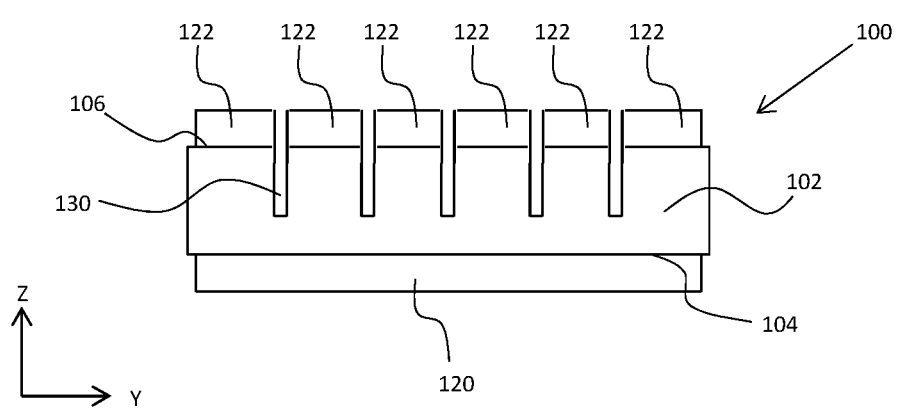
FIG. 6 is a side view of a monolithic two-dimensional VCSEL array according to an embodiment.

FIG. 6 shows a side view of monolithic two-dimensional VCSEL array 100, looking along a x-direction. Trenches 130 are provided between respective second metal contacts 122 and extend into monolithic structure 102.

Trenches 130 are formed during one embodiment of a manufacturing process of monolithic two-dimensional VCSEL array 100, as explained herein. Trenches 130 may extend to the active layer of the VCSELs, or to a predetermined depth into the monolithic structure 102.

Figure 7:
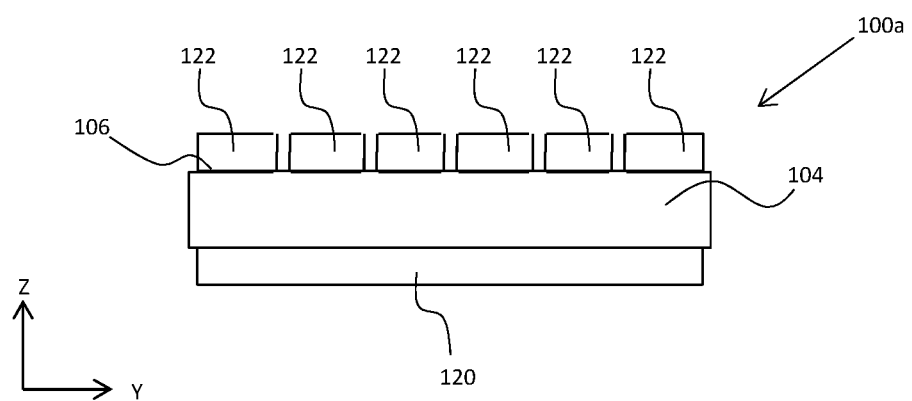
FIG. 7 is a side view of a monolithic two-dimensional VCSEL array according to an embodiment.

FIG. 7 shows a side view of another embodiment of monolithic two-dimensional VCSEL array 100a. In the manufacturing process of monolithic two-dimensional VCSEL array 100a, the monolithic structure 102 of FIGS. 3-6 may be thinned to form thinned monolithic structure 104, and second metal contacts 122 are subsequently added to a rear surface 106 of monolithic two-dimensional VCSEL array 100a.

Figure 8:
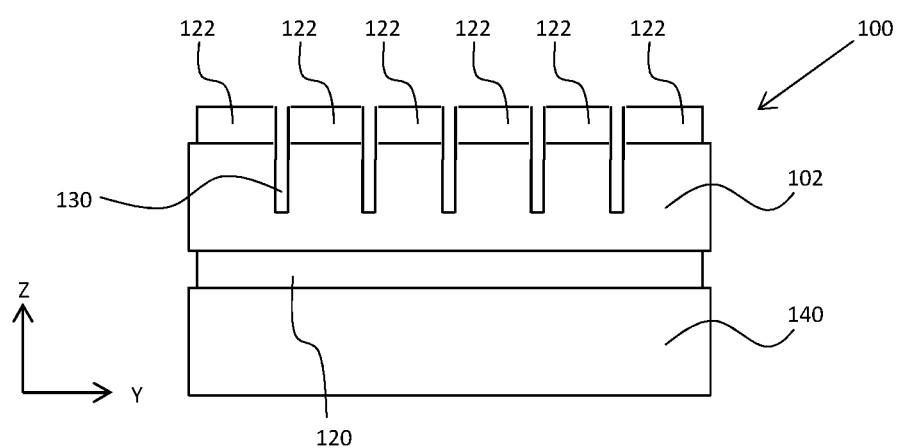
FIG. 8 is a side view of a monolithic two-dimensional VCSEL array according to an embodiment.

As shown in FIG. 8, monolithic two-dimensional VCSEL array 100 may also include a transparent substrate 140 bonded to first metal contacts 120. Transparent substrate 140 provides mechanical support to monolithic two-dimensional VCSEL array 100. Transparent substrate 140 may be formed of glass. In one exemplary embodiment, transparent substrate 140 may be formed of Tin(Sn)-coated glass and bonded to first metal contacts 120 through eutectic bonding.

Figure 9:
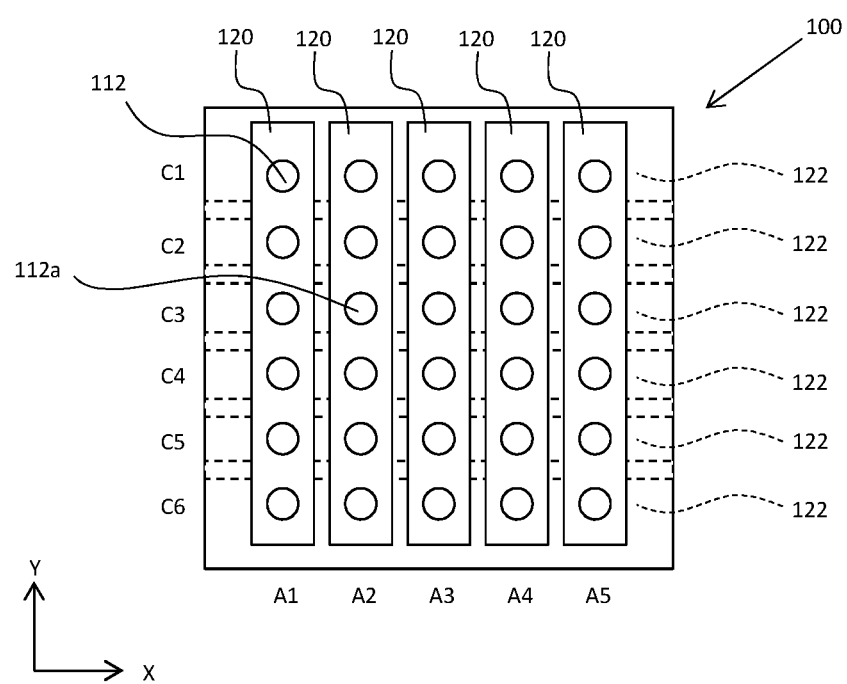
FIG. 9 is a front view of a monolithic two-dimensional VCSEL array according to an embodiment.

Operation of monolithic two-dimensional VCSEL array 100 will be described with reference to FIG. 9. In use, the first metal contacts 120 may serve as anodes for individual VCSELs 112, and second metal contacts 122 may serve as cathodes for individual VCSELs 112. As FIG. 9 is a front view of monolithic two-dimensional VCSEL array 100, the corresponding positions of second metals contacts 122 are shown in dashed lines. It will be understood that the first metal contacts 120 and second metal contacts 122 may define a coordinate system for individual VCSELs 112. For illustrative purposes, the first metal contacts 120 have been respectively labelled A1, A2, A3, A4, and A5; and the second metal contacts 122 have been respectively labelled C1, C2, C3, C4, C5, and C6. To operate a particular VCSEL 112, a first voltage may be applied to one of the first metal contacts 120, and a second voltage may applied to one of the second metal contacts 122. For example, to activate the specific VCSEL labelled 112a, the first voltage may be applied to the first metal contact 120 labelled A2, and the second voltage may be applied to the second metal contact 122 labelled C3. Thus, each individual VCSEL may be operated ranging from the VCSEL at [A1,C1] to [A5,C6]. In this way, it will be understood that each possible combination of a first metal contact 120 and a second metal contact 122 electrically connects to a single VCSEL. In other words, each possible combination of a first metal contact 120 and a second metal contact 122 may correspond to only one particular VCSEL. This allows random access to each VCSEL of the entire array, such that individual VCSELs may be illuminated in any possible pattern desired.

Figure 10:
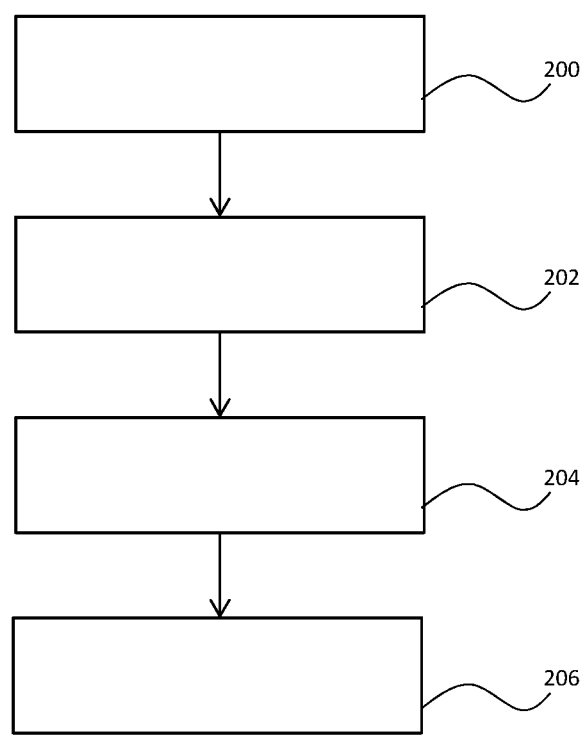
FIG. 10 is a flowchart of a manufacturing process of a monolithic two-dimensional VCSEL array according to an embodiment.

FIG. 10 is a flowchart describing an embodiment of a manufacturing process for a monolithic two-dimensional VCSEL array.

At block 200, a monolithic VCSEL array is provided. The monolithic VCSEL array may include a plurality of VCSELs arranged in a two-dimensional matrix. The monolithic VCSEL array may include a front metal layer provided on a light-emitting surface of the VCSEL array, and a rear metal layer provided on a rear surface opposite to the light emitting surface.

At block 202, the front metal layer may be patterned into the desired first metal contacts. Each of the patterned first metal contacts may be electrically connected to each VCSEL of a corresponding first line of the plurality of first lines of VCSELs (see FIG. 3, for example).

In block 204, a transparent substrate may be bonded to the first metal contacts. In practical applications, VCSELs typically require a transparent substrate over the light-emitting surface. Conventionally, this transparent substrate may be applied after fabrication of the VCSEL array. However, in this embodiment, the transparent substrate may be bonded to the first metal contacts in block 204, thus eliminating a later processing while providing mechanical support for the array during fabrication.

In block 206, trenches may be formed the rear layer metal layer and into the VCSEL array. The trenches may be formed by etching, by cutting with a laser, mechanical cutting, or other suitable process. The trenches may be formed down to the active layer of the VCSEL, or the trenches may be formed to a predetermined depth into the array. In forming the trenches, the array may be rotated 90 degrees from the position in which the patterning of the first metal contacts is performed in block 202. However, it will be understood that such rotation is not limited to 90 degrees, as long as the trenches (and accordingly, the second metal contacts) are non-parallel with the first metal contacts. The formation of the trenches separates the rear metal layer into second metal contacts, each of the plurality of second metal contacts being electrically connected to each VCSEL of a corresponding second line of the plurality of second lines of VCSELs (see FIG. 4 and FIG. 6, for example). The first metal contacts and second metal contacts may be arranged such that each combination of a first metal contact and a second metal contact is electrically connected to one VSCEL of the plurality of VCSELs.

Figure 11:
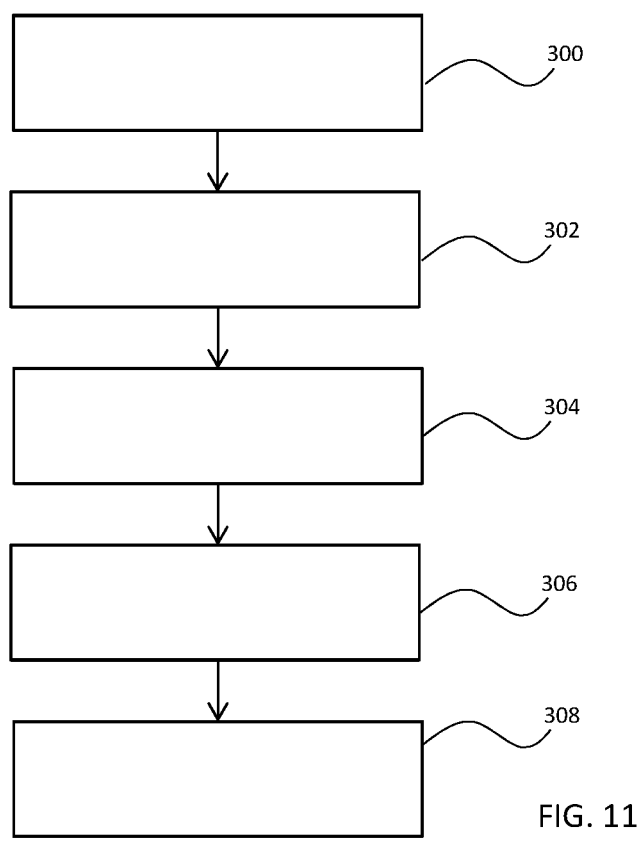
FIG. 11 is a flowchart of a manufacturing process of a monolithic two-dimensional VCSEL array according to an embodiment.

FIG. 11 is a flowchart describing another embodiment of a manufacturing process for a monolithic two-dimensional VCSEL array.

At block 300, a monolithic VCSEL array is provided. The monolithic VCSEL array may include a plurality of VCSELs arranged in a two-dimensional matrix. The monolithic VCSEL array may include a front metal layer provided on a light-emitting surface of the VCSEL array, and a rear metal layer provided on a rear surface opposite to the light emitting surface.

At block 302, the front metal layer may be patterned into the desired first metal contacts. Each of the patterned first metal contacts may be electrically connected to each VCSEL of a corresponding first line of the plurality of first lines of VCSELs, as illustrated in FIG. 3 for example.

In block 304, a transparent substrate may be bonded to the first metal contacts. In practical applications, VCSELs typically require a transparent substrate over the light-emitting surface. Conventionally, this transparent substrate may be applied after fabrication of the VCSEL array. However, in this embodiment, the transparent substrate may be bonded to the first metal contacts in block 304, thus eliminating a later processing while providing mechanical support for the array during fabrication.

Figure 12:
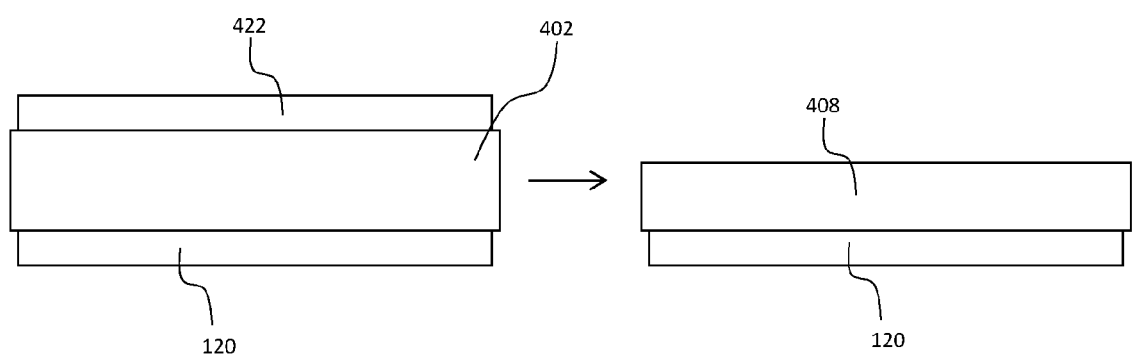
FIG. 12 is a diagram showing the thinning of the VCSEL array according to an embodiment.

In block 306, the rear metal layer and part of the VCSEL array may be removed. For example, FIG. 12 shows an unfinished structure which includes rear metal layer 422. By a process such as etching or cutting, rear metal layer 422 and part of monolithic structure 402 is removed to result in a thinned monolithic structure 408. In another embodiment, the rear metal layer 422 may not even be formed at all, and it may only be necessary to remove a part of monolithic structure 402.

In block 308, second metal contacts are deposited on a rear surface of the array, each of the plurality of second metal contacts being electrically connected to each VCSEL of a corresponding second line of the plurality of second lines of VCSELs. The first metal contacts and second metal contacts may be arranged such that each combination of a first metal contact and a second metal contact is electrically connected to one VSCEL of the plurality of VCSELs.

Figure 13:
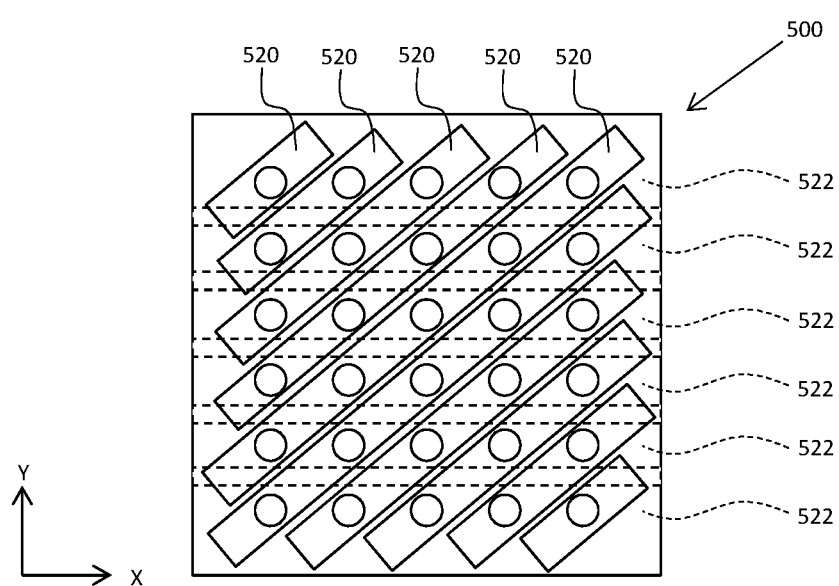
FIG. 13 is a front view of a monolithic two-dimensional VCSEL array according to an embodiment.

In the embodiments described above, the first direction and the second direction (and correspondingly, the first metal contacts and the second metal contacts) have been perpendicular. However, the invention is not limited to this embodiment. For example, FIG. 13 shows an embodiment of a monolithic two-dimensional VCSEL array 500 in which the first direction and the first metal contacts 520 may be non-perpendicular with respect to the second direction and the second metal contacts 522. It will be understood that any orientation of the first metal contacts 520 and 522 may be used as long as each combination of a first metal contact 520 and a second metal contact 522 corresponds to a single VCSEL.

The embodiments described above may have important benefits over conventional structures. For example, the embodiments eliminate the need for bonding wirings in a two-dimensional VCSEL array. Also, the embodiments result in a more efficient use of VCSEL area compared to conventional devices, with less wasted VCSEL area.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A two-dimensional (2D) vertical-cavity surface emitting laser (VCSEL) array comprising:
   a VCSEL array comprising:
      a plurality of VCSELs arranged in a two dimensional matrix, the plurality of VCSELs forming a monolithic structure;
      a light-emitting surface; and
      a rear surface opposite to the light emitting surface;
      wherein the plurality of VCSELs are arranged in a plurality of first lines of VCSELs in a first direction and a plurality of second lines of VCSELs in a second direction, the first direction being non-parallel to the second direction;
   a plurality of first metal contacts provided on the light-emitting surface; and
   a plurality of second metal contacts provided on the rear surface;
   wherein each of the plurality of first metal contacts is electrically connected to each VCSEL of a corresponding first line of the plurality of first lines of VCSELs;
   wherein each of the plurality of second metal contacts is electrically connected to each VCSEL of a corresponding second line of the plurality of second lines of VCSELs;
   wherein the plurality of first metal contacts and the plurality of second metal contacts are arranged such that each combination of a first metal contact and a second metal contact is electrically connected to one VSCEL of the plurality of VCSELs.

2. The 2D VCSEL array of claim 1, wherein the VCSEL wafer further comprises a plurality of trenches extending from the rear surface, each of the plurality of trenches being positioned between adjacent second lines of VCSELs.

3. The 2D VCSEL array of claim 1, further comprising a transparent substrate bonded to the plurality of first metal contacts.

4. The 2D VCSEL array of claim 3, wherein the transparent substrate comprises Sn-covered glass and the transparent substrate is bonded to the first metal contacts by eutectic bonding.

5. The 2D VCSEL array of claim 1, wherein the first direction is perpendicular to the second direction.

6. A method of manufacturing a two-dimensional (2D) vertical-cavity surface emitting laser (VCSEL) array, the method comprising:
   providing a VCSEL array comprising:
      a plurality of VCSELs arranged in a two dimensional matrix, the plurality of VCSELs forming a monolithic VCSEL structure having a light-emitting surface and a rear surface opposite to the light-emitting surface;
      a front metal layer provided on the light-emitting surface; and
      a rear metal layer provided on the rear surface;
      wherein the plurality of VCSELs are arranged in a plurality of first lines of VCSELs in a first direction and a plurality of second lines of VCSELs in a second direction, the first direction being non-parallel to the second direction;
   patterning the front metal layer into a plurality of first metal contacts, each of the plurality of first metal contacts being electrically connected to each VCSEL of a corresponding first line of the plurality of first lines of VCSELs;
   forming, through the rear metal layer and into the monolithic VCSEL structure, a plurality of trenches to a predetermined depth so as to separate the other of the front metal layer and the rear metal layer into a plurality of second metal contacts, each of the plurality of second metal contacts being electrically connected to each VCSEL of a corresponding second line of the plurality of second lines of VCSELs;
   wherein the plurality of first metal contacts and the plurality of second metal contacts are arranged such that each combination of a first metal contact and a second metal contact is electrically connected to one VSCEL of the plurality of VCSELs.

7. The method of claim 6, wherein the plurality of trenches are formed by etching.

8. The method of claim 6, wherein plurality of trenches are formed by cutting.

9. The method of claim 6, further comprising:
   bonding a transparent substrate to the plurality of first metal contacts before the plurality of trenches are formed.

10. The method of claim 9, wherein the transparent substrate comprises Sn-covered glass and the transparent substrate is bonded to the first metal contacts by eutectic bonding.

11. The method of claim 6, wherein the first direction is perpendicular to the second direction.

12. A method of manufacturing a two-dimensional (2D) vertical-cavity surface emitting laser (VCSEL) array, the method comprising:
   providing a VCSEL array comprising:
      a plurality of VCSELs arranged in a two dimensional matrix, the plurality of VCSELs forming a monolithic VCSEL structure having a light-emitting surface and a rear surface opposite to the light-emitting surface; and
      a front metal layer provided on the light-emitting surface;
      wherein the plurality of VCSELs are arranged in a plurality of first lines of VCSELs in a first direction and a plurality of second lines of VCSELs in a second direction, the first direction being non-parallel to the second direction;
   patterning the front metal layer into a plurality of first metal contacts, each of the plurality of first metal contacts being electrically connected to each VCSEL of a corresponding first line of the plurality of first lines of VCSELs;
   forming a plurality of a plurality of second metal contacts on the rear surface, each of the plurality of second metal contacts being electrically connected to each VCSEL of a corresponding second line of the plurality of second lines of VCSELs;
   wherein the plurality of first metal contacts and the plurality of second metal contacts are arranged such that each combination of a first metal contact and a second metal contact is electrically connected to one VSCEL of the plurality of VCSELs.

13. The method of claim 12, wherein the VCSEL array further comprises a second metal layer provided on the rear surface; and the method further comprises removing the second metal layer before forming the plurality of second metal contacts.

14. The method of claim 13, further comprising removing a part of the monolithic VCSEL structure to a predetermined depth.

15. The method of claim 14, wherein the second metal layer and the part of the monolithic VCSEL structure are removed by etching.

16. The method of claim 15, wherein the second metal layer and the part of the monolithic VCSEL structure are removed mechanically.

17. The method of claim 12, further comprising:

bonding a transparent substrate to the plurality of first metal contacts.

18. The method of claim 17, wherein the transparent substrate comprises Sn-covered glass and the transparent substrate is bonded to the first metal contacts by eutectic bonding.

19. The method of claim 12, wherein the first direction is perpendicular to the second direction.

* * * * *